(12) United States Patent
Lee

(10) Patent No.: US 8,400,136 B2
(45) Date of Patent: Mar. 19, 2013

(54) CURRENT MIRROR SEMICONDUCTOR DEVICE AND A LAYOUT METHOD OF THE SAME

(75) Inventor: Kang Seol Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 1240 days.

(21) Appl. No.: 12/198,562

(22) Filed: Aug. 26, 2008

(65) Prior Publication Data
US 2009/0066314 A1    Mar. 12, 2009

(30) Foreign Application Priority Data

Sep. 10, 2007   (KR) .................. 10-2007-0091692

(51) Int. Cl.
G05F 3/16    (2006.01)
(52) U.S. Cl. ....................................... 323/315
(58) Field of Classification Search ........... 323/312–316
See application file for complete search history.

(56) References Cited

U.S. PATENT DOCUMENTS

| | | | |
|---|---|---|---|
| 6,194,887 B1 | 2/2001 | Tsukada | |
| 6,788,237 B1* | 9/2004 | Bidermann et al. | 341/155 |
| 7,486,563 B2* | 2/2009 | Waller et al. | 365/185.21 |
| 8,093,924 B2* | 1/2012 | Kamenicky et al. | 327/108 |
| 2002/0118568 A1* | 8/2002 | Tanzawa | 365/185.11 |
| 2006/0006312 A1 | 1/2006 | Kiji | |

FOREIGN PATENT DOCUMENTS

| | | |
|---|---|---|
| JP | 05-127764 A | 5/1993 |
| JP | 2005-243928 A | 9/2005 |
| KR | 1020000035227 A | 6/2000 |
| KR | 2005-0089024 A | 9/2005 |

\* cited by examiner

*Primary Examiner* — Adolf Berhane
(74) *Attorney, Agent, or Firm* — Ladas & Parry LLP

(57) ABSTRACT

A semiconductor device and a layout method of the same reduce a mismatch in a semiconductor device. The semiconductor device includes a first transistor unit providing a first path of current and a second transistor unit designed in a mirror structure to the first transistor unit and providing a second path of current. The layout of the second transistor unit has a shape identical to the first transistor unit and shifted in a first direction. The layout of the semiconductor device reduces a mismatch of the transistors occurring when masks are combined, and thereby reduces their offset.

16 Claims, 15 Drawing Sheets

CURRENT MIRROR SEMICONDUCTOR DEVICE AND A LAYOUT METHOD OF THE SAME

CROSS-REFERENCE TO RELATED APPLICATIONS

The present application claims priority to Korean patent application number 10-2007-0091692 filed on Sep. 10, 2007, which is incorporated herein by reference in its entirety.

BACKGROUND OF THE INVENTION

The present invention relates to semiconductor devices and to layout methods, and more particularly to a current mirror semiconductor device and a layout method of the same, which can reduce mismatching layout errors of a semiconductor device having a mirror structure.

Typically, semiconductor devices are formed with transistors made by a combination of different masks. These masks are manufactured to produce several tens of layers and are combined, and patterns of the masks are formed using a photo device. Dies within a wafer are designed under the same or similar conditions, but slight differences in positions within the wafer may occur due to various variables during processing. These differences often occur due to mismatching of the various combinations of masks, etc. A mismatch in the combination of the masks leads to mismatch errors in transistors that often times result in performance degradation of the transistors.

Of particular interest is semiconductor devices that are configured to have current mirror structures, for example, groupings of transistors configured as voltage generators and/or as sense amplifiers, or the like. These types of semiconductor devices seem to be more prone to being adversely affected by mismatching a combination of the masks.

A mismatch of transistors occurring during the combination of masks in a semiconductor device having a mirror structure will be described with reference to FIGS. 1 to 3.

As depicted in FIG. 1, a typical voltage generator includes PMOS transistors P0, P0B; NMOS transistors N0, N0B, both of which have a mirror structure; an NMOS transistor N1 holding bias voltage; and a PMOS transistor P1 selectively pumping output voltage.

Respective gates of the NMOS transistors N0, N0B receive a reference voltage VREFC and a comparison voltage (for example, a core voltage VCORE) and a gate of the NMOS transistor N1 receives a voltage generating enable signal EN.

The voltage generator compares the core voltage VCORE to the reference voltage, thereby selectively driving the PMOS transistor P1 and outputting the core voltage VCORE with the same voltage level as that of the reference voltage VREFC. A layout of the voltage generator corresponding to an the region including the mirror structure of FIG. 1 will be described with reference to FIG. 2.

The PMOS transistors P0, P0B arranged within an N well region 10 and the NMOS transistors N0, N0B arranged within a P-type substrate 20 have a symmetric structure to each other based on a Y-axis, i.e., a commonly shared lengthwise boundary.

Specifically, the PMOS transistor P0 is arranged in order of a source S0 to a drain D0 along one direction (in FIG. 2, proceeding from a left to right direction). On the other hand, the complementary PMOS transistor P0B is arranged in order of a drain D0B to a source S0B with respect to proceeding from the left to a right direction.

Likewise, the NMOS transistor N0 is arranged in order of a source S1 to a drain D1 with respect to proceeding from the left to right direction and the NMOS transistor N0B is arranged in order of a drain D1B to a source S1B with respect to proceeding from the left to right direction.

A drain D1 of the NMOS transistor N1 is arranged at a node ND1 to which the sources of the NMOS transistors N0, N0B are commonly connected.

If the PMOS transistors P0, P0B and the NMOS transistors N0, N0B are designed under the same conditions and are formed at defined positions irrespective of alignment variables during a masking process, the resultant voltage generator prevents the mismatch to exert the same performance and reduce the offset, making it possible to assure mass productivity and to increase reliability of the semiconductor device.

Furthermore, if the NMOS transistor N1 is connected to a point which is an exact half from the sources S1, S1B of the NMOS transistors N0, N0B, then the mismatch alignment errors of the NMOS transistors N0, N0B can be reduced.

However, when the transistors are configured in a current mirror type structure as shown in FIG. 2, then these transistors are often symmetrically laid out with respect to one direction (herein, along a Y-axis direction also referred to a commonly shared lengthwise boundary). As a result of this symmetrically laid out design, the resultant transistors suffer a large number of mismatch errors as a result of the mismatch alignment of the plurality of transistors employing these combinations of masks.

As depicted in FIG. 3a, when a contact mask is misaligned by being inclined to one direction, for example, a left direction from a reference position, a contact distance CD1 of the gate G1 and the drain of the NMOS transistor N0 is shorter than a contact distance CS1 of the gate G1 and the source thereof. On the other hand, a contact distance CD1B of the gate G1B and the drain of the NMOS transistor N0B is longer than a contact distance CS1B of the gate G1B and the source thereof.

As depicted in FIG. 3b, when a gate mask is misaligned by being inclined to another direction, for example, a right direction from the reference position, the gate G1 of the NMOS transistor N0 is overlapped with a portion of the drain D1 thereof, while the gate G1B of the NMOS transistor N0B is overlapped with a portion of the source S1B thereof.

As depicted in FIG. 3c, when a mask for a device isolation layer is misaligned by being inclined toward one direction, for example, a right direction from the reference position, the source S1 of the NMOS transistor N0 is reduced and the drain D1 thereof is increased, while the source S1B of the NMOS transistor N0B is increased and the drain D1B thereof is reduced.

Generally, drain-source current Ids of the transistor is proportional to $\{(V_{gs}-V_t)*V_{ds}-\text{the square of } \frac{1}{2}V_{ds}\}$ in a linear region and is proportional to $\{\text{the square of }(V_{gs}-V_t)\}$ in a saturation region. As a result of this relationship, the drain-source current Ids exhibits a proportional relation with the source of the transistor in the linear region and the saturation region.

However, as shown in FIGS. 3a to 3c, when the transistors are not accurately formed at the positions defined in the design of the transistors due to mismatch errors in the combination of the masks, the threshold voltage $V_t$ of the transistor and drain-source current $I_{dsat}$ value in the saturation region are changed.

Therefore, the performance of semiconductor devices, in particular current mirror configurations, can be adversely affected by mismatch errors when combining the masks to build symmetrically laid out devices.

Also, even though the NMOS transistor N1 is connected at a point which is substantially at an exact halfway point from the sources of the NMOS transistors N0, N0B; these mismatch errors can still adversely affect the resultant NMOS transistor N0 having the same arrangement structure and the NMOS transistor N0B having the opposite arrangement structure.

SUMMARY OF THE INVENTION

The present invention provides a current mirror semiconductor device having a mirror structure electronic configuration and a layout method of the same, which can reduce a mismatch error associated with transistors built with a combination of masks.

The present invention can provide an advantage of reduces offset of transistors to improve mass productivity and reliability of a semiconductor device.

There is provided a semiconductor device including; a first transistor unit providing a first path of current; and a second transistor unit designed in a mirror structure to the first transistor unit and providing a second path of current, a layout of the second transistor unit having a shape substantially shifting a layout of the first transistor unit.

Preferably, each of the first transistor unit and the second transistor unit includes at least two transistors.

The first transistor unit includes a first power supply transistor which supplies power supply voltage to the first path of current in accordance to any one voltage of the first path of current and the second path of current applied to its gate; and a first current control transistor which controls current flowing in the first path of current in accordance to the first voltage applied to its gate.

The second transistor unit includes a second power supply transistor which supplies the power supply voltage to the second path of current in accordance to any one voltage of the first path of current and the second path of current applied to its gate; and a second current control transistor which controls current flowing in the second path of current in accordance to the second voltage applied to its gate.

Preferably, the first and second power supply transistors include a PMOS transistor whose gate is commonly connected to any one of the first path of current and the second path of current.

Preferably, the first and second power supply transistors include a PMOS transistor whose gate is connected to the first path or the second path of different current.

Preferably, the first and second current control transistors include a NMOS transistor whose gate is commonly connected to any one of the first path of current and the second path of current.

Preferably, the first and second current control transistors include a NMOS transistor whose gate is connected to the first voltage and the second voltage with different level.

Preferably, the first voltage is reference voltage and the second voltage is comparison voltage.

Preferably, the first voltage is local input/output line voltage and the second voltage is inverted input/output line voltage.

Preferably, the semiconductor device is any one of a voltage generator, a sense amplifier, and a reference voltage generator.

There is provided a layout method of a semiconductor device including the steps of: arranging first transistors providing a first path of current; and arranging second transistors, which have a mirror structure to the first transistors in view of a circuit and provides a second path of current, in a shape substantially shifting a layout of the first transistors.

Preferably, the first and second transistors are laid out using a combination of a plurality of masks.

Preferably, the first transistors includes at least one PMOS transistor arranged to supply power supply voltage to the first path of current in an N well region and at least one NMOS transistor arranged to be electrically connected to the PMOS transistor in a P-type substrate region and to control current from the first path of current.

DESCRIPTION OF SPECIFIC EMBODIMENTS

The present invention discloses a semiconductor device having a current mirror electronic designed structure and a layout method of the same which is capable of improving offset by the same application of mismatch conditions occurring by masks through an arrangement of sources of transistors forming a current mirror structure in the same direction.

The present invention discloses a voltage generator as a first embodiment of a semiconductor device having a current mirror electronic configuration structure.

Figure 4:
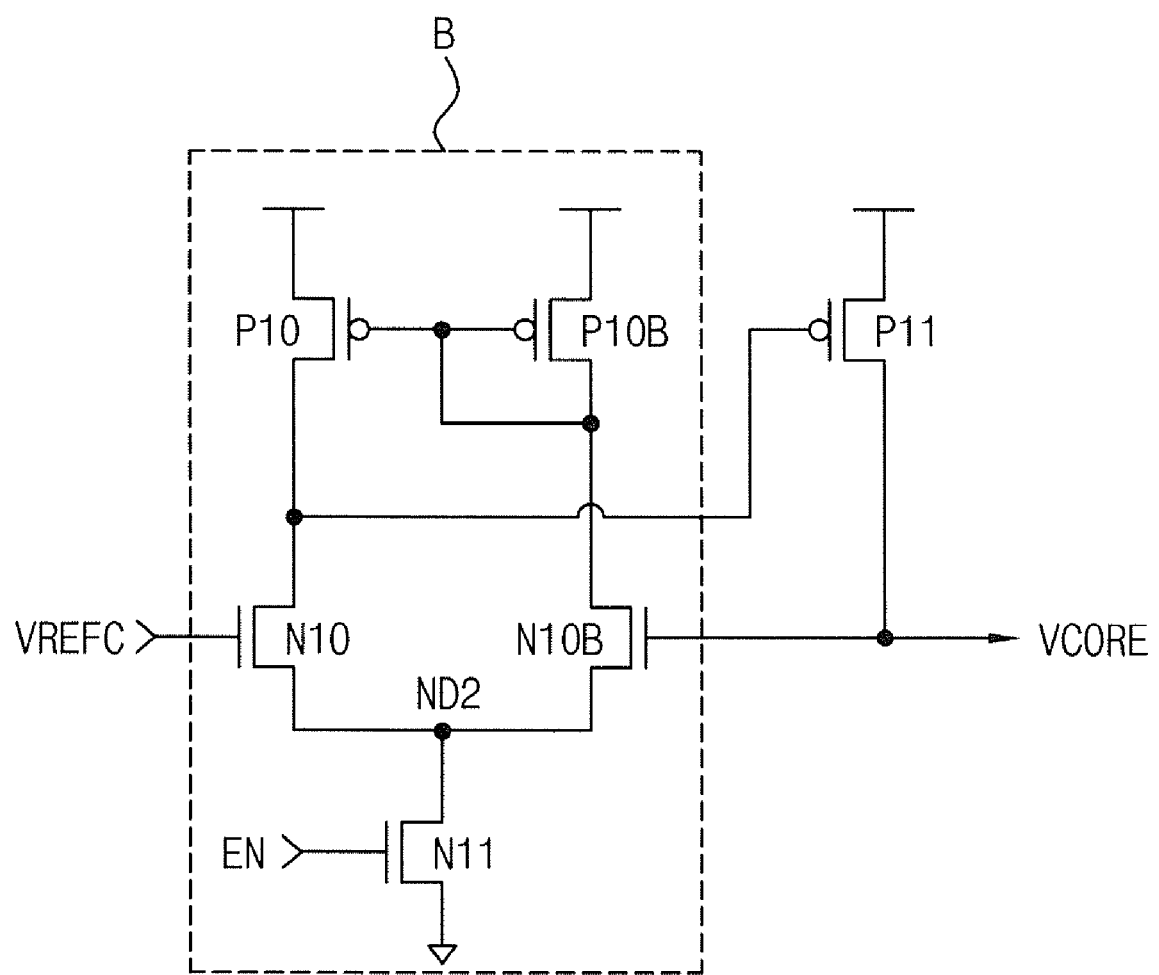
FIG. 4 is a circuit diagram showing a voltage generator according to a first embodiment of the present invention.

As depicted in FIG. 4, the voltage generator includes PMOS transistors P10, P10B, P11 and NMOS transistors N10, N10B, N11.

Specifically, sources of the PMOS transistors P10, P10B are shown connected to a power supply voltage terminal VDD; drains of the NMOS transistors N10, N10B are shown connected to drains of PMOS transistor P10, P10B; and a drain of the NMOS transistor N11 is shown connected to a node ND2 to which the sources of the NMOS transistors N10, N10B are shown commonly connected and a source thereof is shown to be connected to a ground voltage terminal VSS.

The gates of the PMOS transistors P10, P10B are shown connected to a common drain of the PMOS transistor P10B and the NMOS transistor N10B and respective gates of the NMOS transistors N10, N10B are shown to be applied with a reference voltage VREFC and a comparison voltage VCORE, and a gate of the NMOS transistor N11 is shown applied with a voltage generating enable signal EN.

Herein, a source of the PMOS transistor P11 is shown connected to the power supply voltage terminal VDD, a drain thereof is shown connected to the gate of the NMOS transistor N10B, and a gate thereof is shown connected a common drain of the PMOS transistor P10 and the NMOS transistor N10.

The voltage generator configured as above compares the reference voltage VREFC applied to the gates of the NMOS transistors N10 to the comparison voltage (for example, the core voltage VCORE) applied to the gate of the NMOS transistor N10B so that the PMOS transistor P11 is selectively driven, thereby outputting the core voltage VCORE with substantially the same level as that of the reference voltage VREFC.

Figure 5:
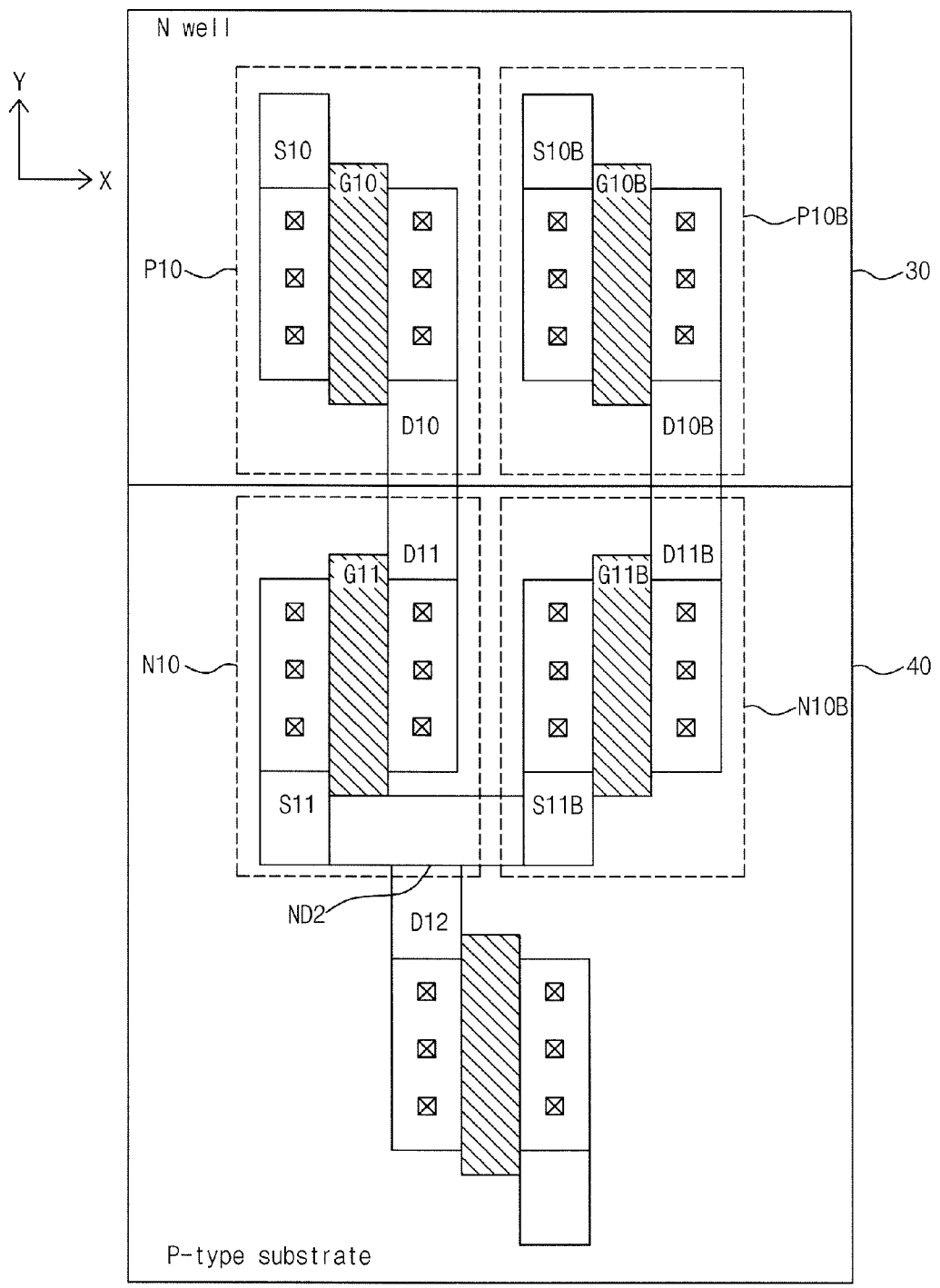
FIG. 5 is a layout diagram showing the voltage generator of FIG. 4 laid out according to the present invention.

A layout of the voltage generator corresponding to a B region including the current mirror structure of FIG. 4 will be described with reference to FIG. 5.

The PMOS transistor P10 and the NMOS transistor N10, which form a first path of current, are shown serially arranged in an N well region 30 and a P-type substrate 40, and the PMOS transistor P10B and the NMOS transistor N10B, which copy the voltage of the first path of current to form a second path of current, are shown arranged in a shifted structure wherein the PMOS transistor P10 and the NMOS transistor N10 are shifted in a horizontal direction. The NMOS transistor N11 is shown arranged to connect a drain D12 to the node ND2 to which the sources of the NMOS transistors N10, N10B are connected.

For example, when the sources and drains of the PMOS transistor P10 and the NMOS transistor N10, which form the first current path, are arranged in the left to right directional order of a source to a drain (<S10 to D10>, <S11 to D11>) with respect to one direction (in FIG. 5, the left to right direction), the sources and the drains of the PMOS transistor P10B and the NMOS transistor N10B, which form the second current path, are arranged in order of a source to a drain (<S10B to D10B>, <S11B to D11B>) with respect to the same direction.

As above, the transistors having the mirror structure are shown shifted along and subsequently arranged in substantially the same shape so that a change due to the combination of the masks during a process is applied identically. This will be described in detail with reference to FIGS. 6a to 6c.

Figure 6A:
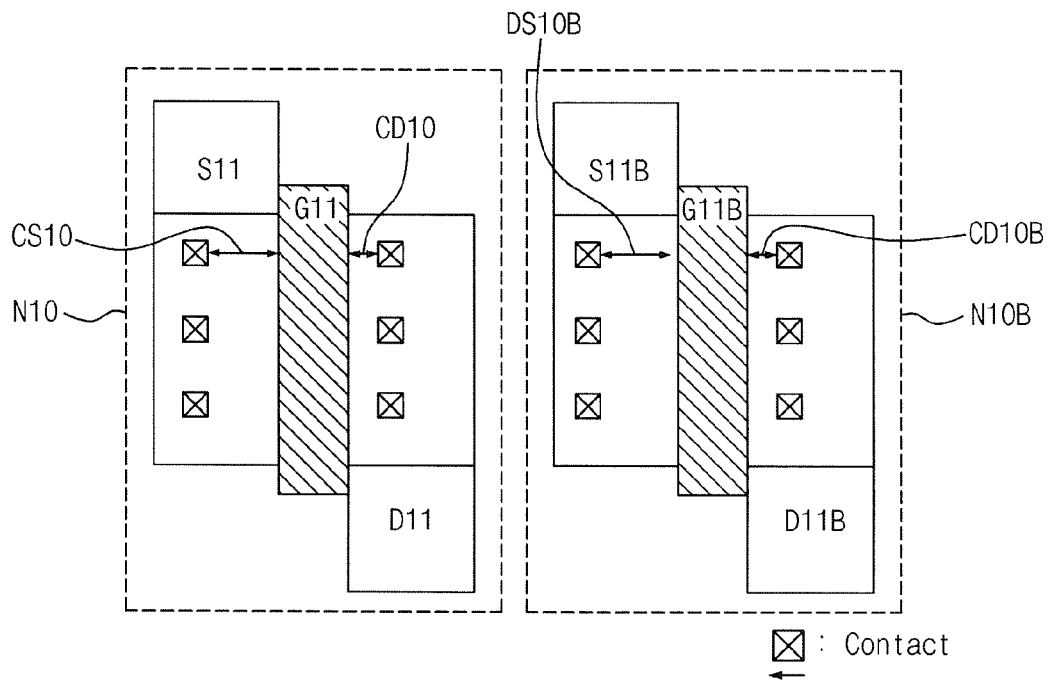
FIG. 6a to 6c are layout diagrams shown for explaining a reduction in mismatch occurring by a combination of masks in transistors having a mirror structure laid out according to the present invention.

As illustrated in FIG. 6a, when a contact mask is inclined to one direction (for example, a direction left of a reference position) the NMOS transistors N10, N10B whose sources and the drains are arranged in the same direction experiencing substantially the same conditions brought about by a mismatch of the contact mask.

In particular since in the NMOS transistor N10, the contact distance CD10 of the gate G11 and the drain of the NMOS transistor N10 is shorter than the contact distance CS10 of the gate G11 and the source thereof, then the contact distance CD11B of the gate G11B and the drain of the NMOS transistor N10B forming the mirror structure thereto is also shorter than the contact distance CS11B of the gate Gb1B and the source thereof. As a result, the mismatch condition of the contact mask is identically applied.

Figure 6B:
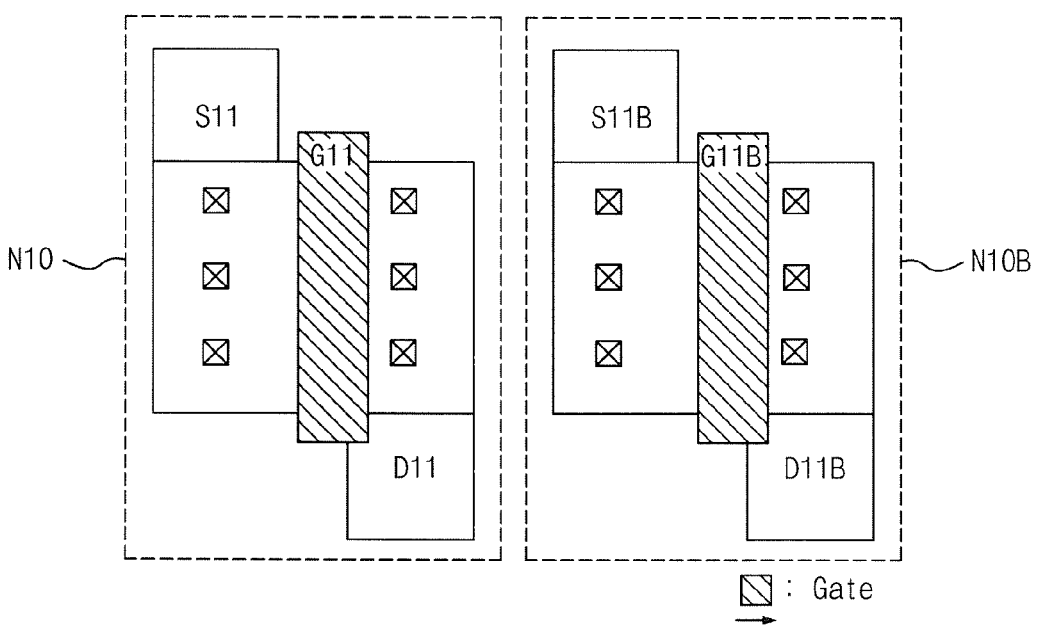

Referring to FIG. 6b, when a gate mask is inclined to one direction, for example, a direction to the right of the reference position, then the gate G11 of the NMOS transistor N0 ends up being overlapped with a portion of the drain D11 thereof. Likewise the gate G1B of the NMOS transistor N10B forming the mirror structure thereto is ends up also being overlapped with a portion of the drain D11B thereof. As a result, the mismatch condition of the gate mask is identically applied.

Figure 6C:
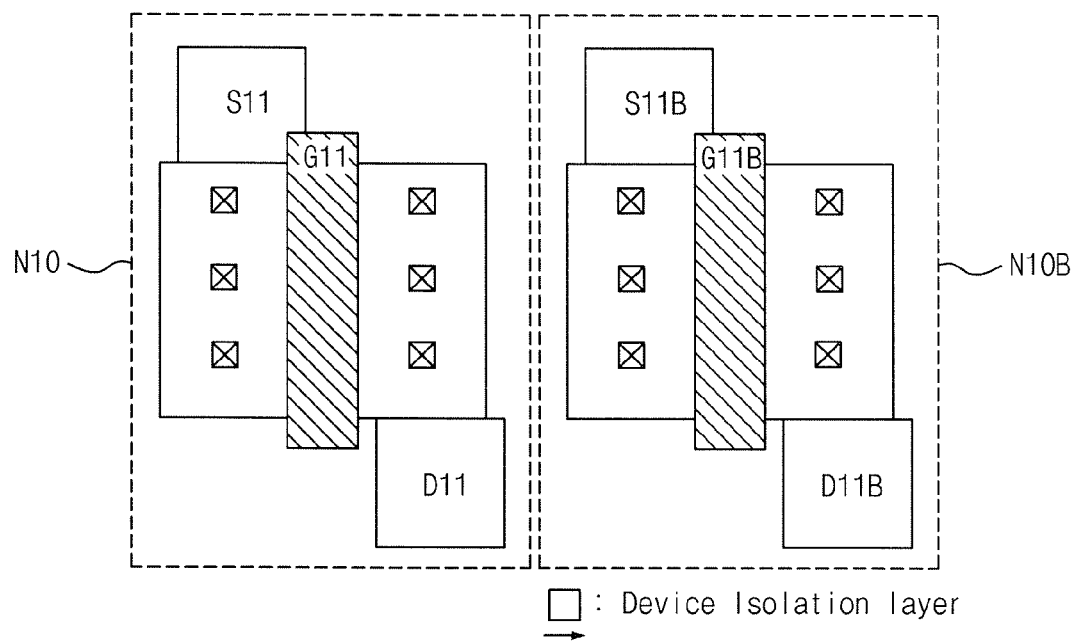
Figure 7:
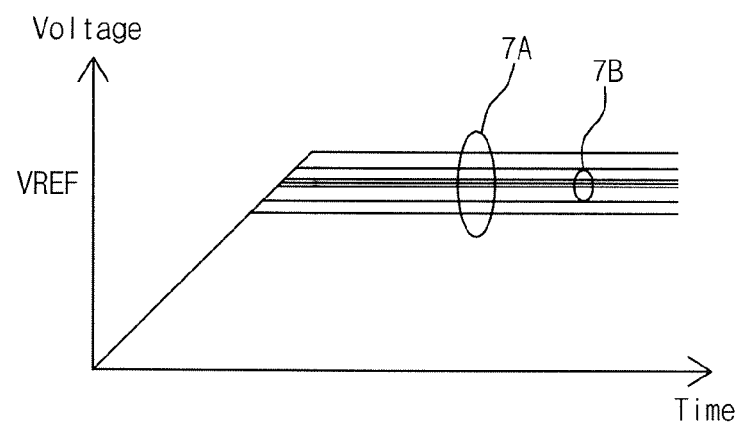
FIG. 7 is a graph comparing output voltage from the voltage generator laid out according to the related art and the voltage generator laid out according to the present invention.

Referring to FIG. 6c, when a mask for a device isolation layer is inclined toward one direction, for example, a direction to the right of the reference position, then the source S11 of the NMOS transistor N0 ends up being reduced and the drain D11 thereof ends up being increased. In contrast, however the source S11B of the NMOS transistor N10B forming the mirror structure thereto ends up being also reduced and the drain D11B thereof ends up being also increased. As a result, the mismatch condition of the device isolation mask is identically applied.

As shown in FIGS. 6a to 6c, the transistors forming the current mirror structure result in being shifted with respect to a horizontal direction so that they are substantially identically laid out. Therefore, the mismatch misalignment error occurring by the combination of the masks ends up being identically applied to each transistor.

As a result threshold voltage Vt and drain-source current Ids of each transistor P10, P10B, N10, N10B are different from their intended design criteria due to a misalignment inclination of the mask along one direction. However since the transistors are subjected to the same process conditions, their respective threshold voltage Vt and drain-source current Ids of the transistors are almost constant.

As a result, the mismatch error of transistors having the current mirror-like structures is substantially reduced, which in turn provides the advantage of improving their offset so that the current mirror function is substantially maintained within the design criteria. Thus, performance is enhanced by making it possible to improve operation reliability of the semiconductor device.

Also, since the NMOS transistors N10, N10B, and N11 have the same layouts, when the drain of the NMOS transistor N11 is connected to the ND2 which is an exact half point from the sources of the NMOS transistors N10, N10B, then the NMOS transistor N11 has substantially the same effect on the NMOS transistors N10, N10B. Thereby making it possible to maintain design performance criteria by designing with the understanding that mismatch errors occur and minimizing their adverse results by laying out the transistors in this innovative manner.

Figure 1:
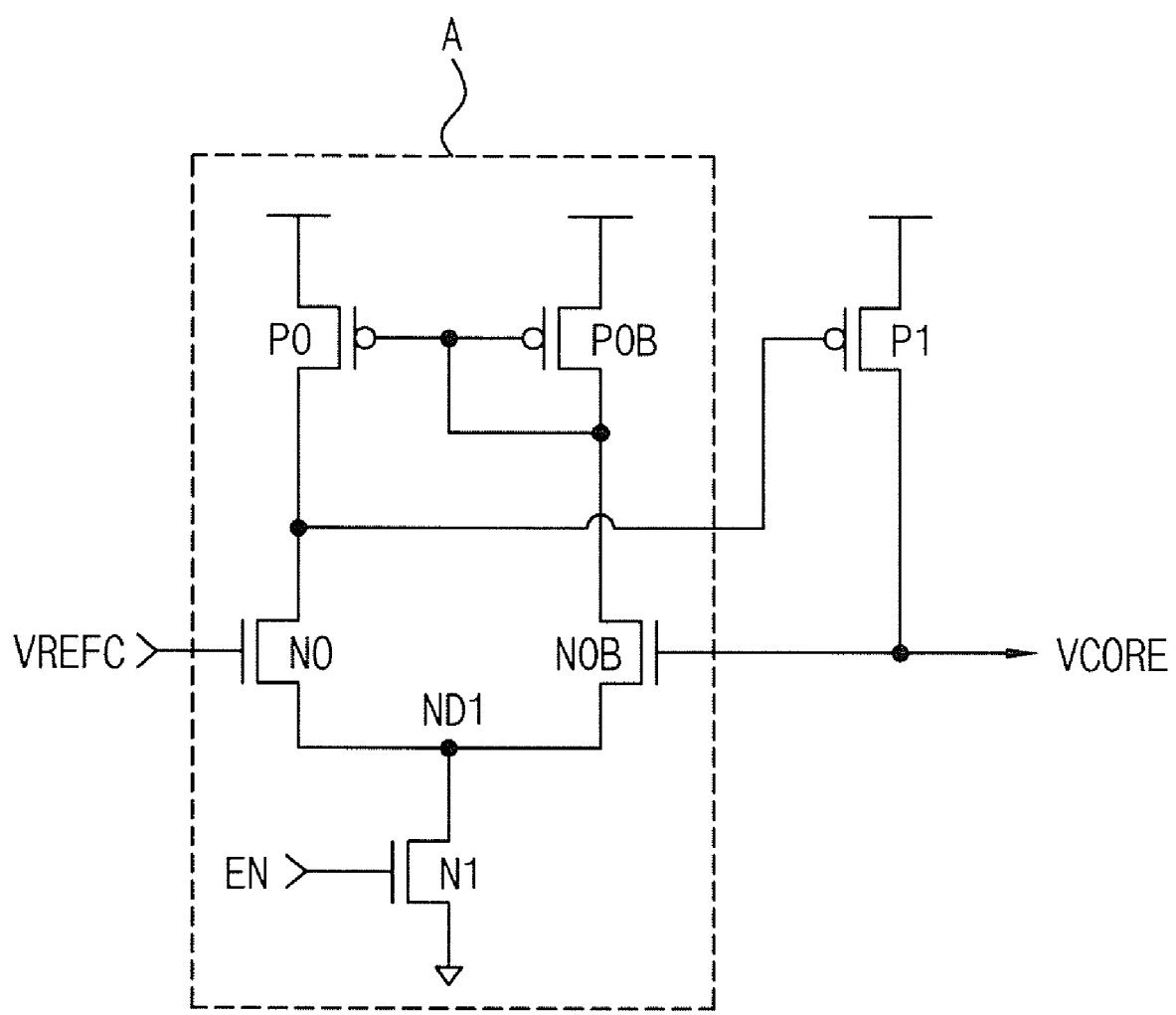
FIG. 1 is a circuit diagram of a general voltage generator.
Figure 2:
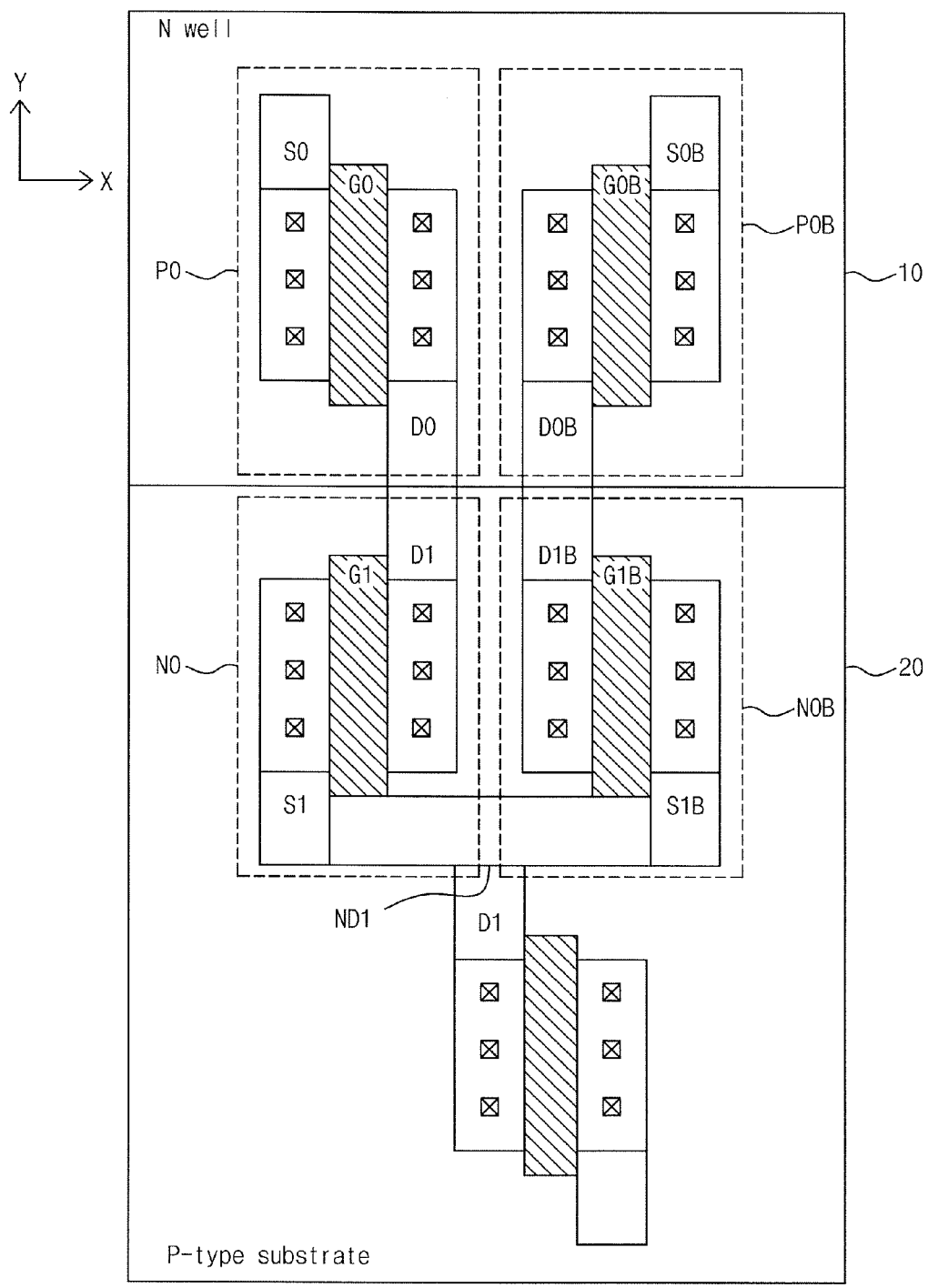
FIG. 2 is a layout diagram of a voltage generator according to the related art.
Figure 3A:
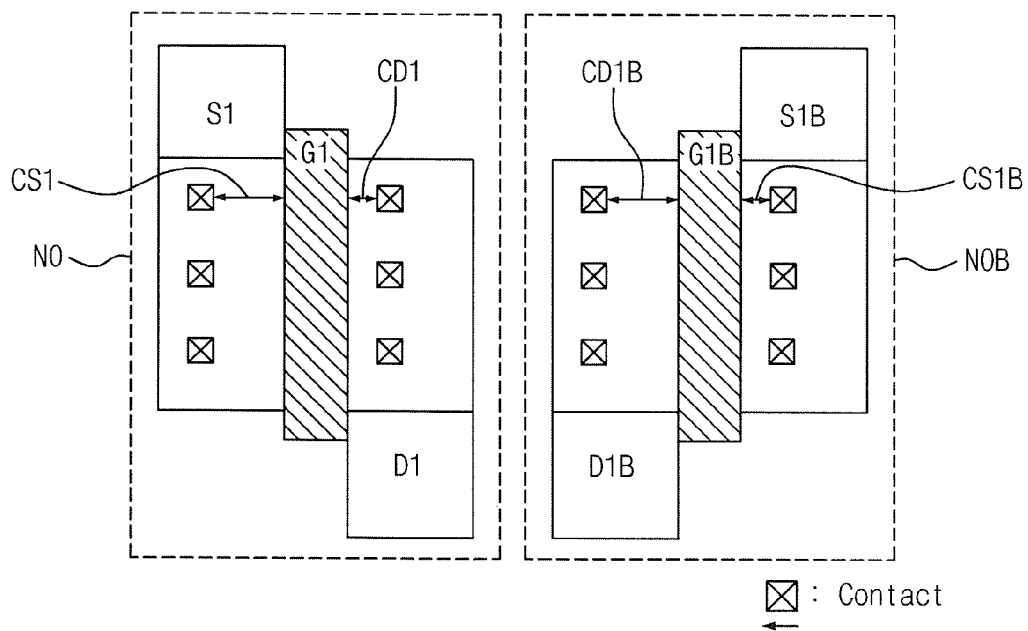
FIGS. 3a to 3c are layout diagrams for explaining a mismatch occurring by a combination of masks in transistors having a mirror structure laid out according to the related art.
Figure 3B:
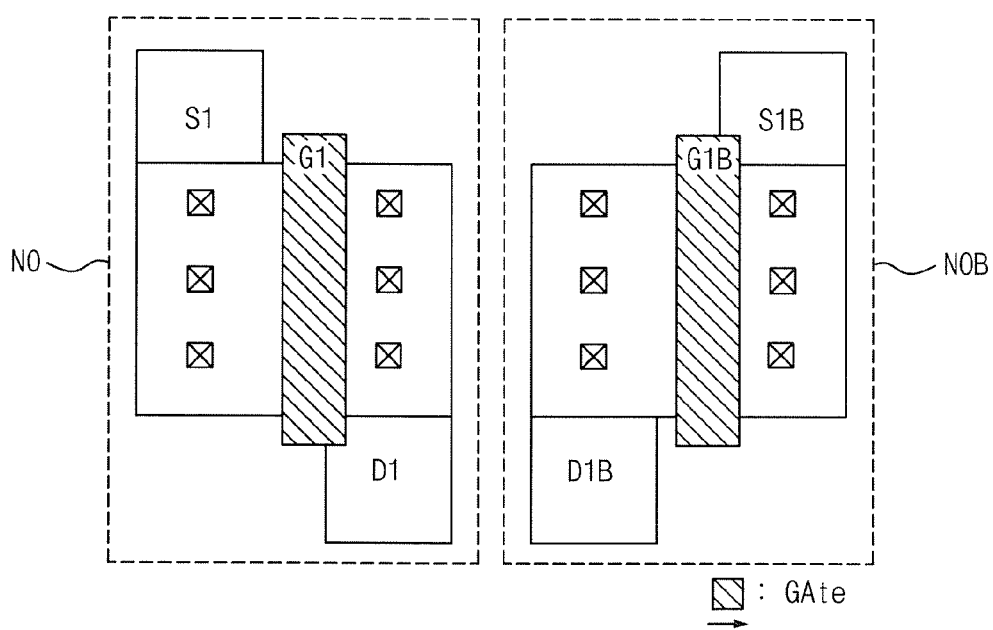
Figure 3C:
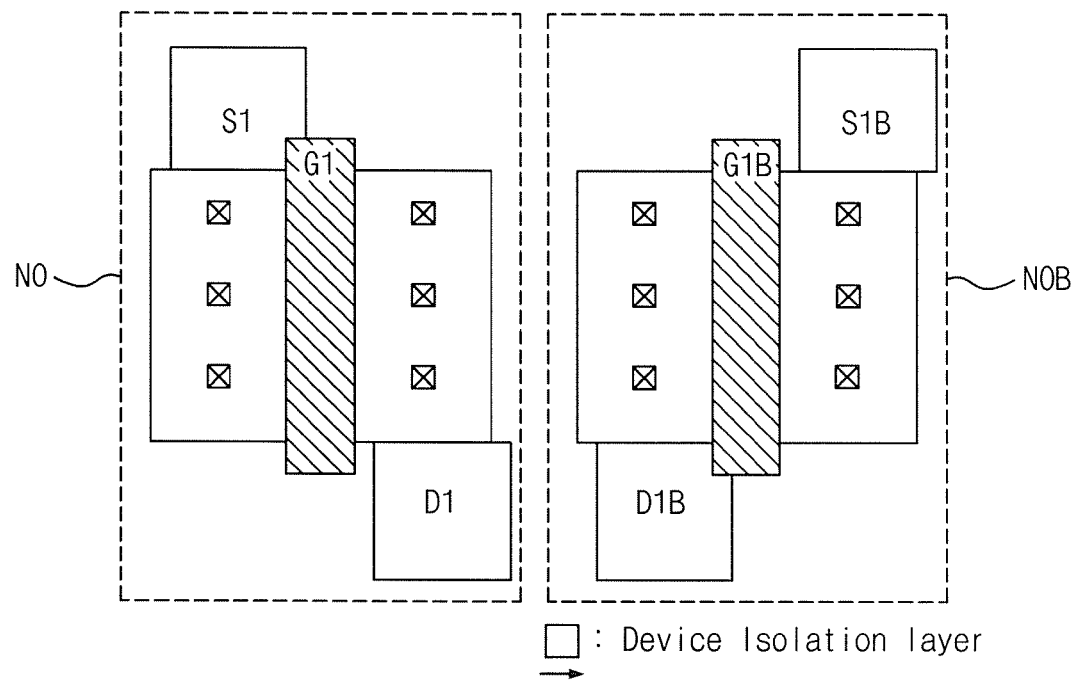

When the levels of the comparison voltage VCORE output from the voltage generator (FIG. 2) laid out according to the related art is compared to the voltage generator (FIG. 5) laid out according to the present invention are compared, the voltage generator laid out according to the related art (FIG. 2) results in exhibiting a larger difference between the level of the comparison voltage VCORE and the level of the reference voltage VREF.

In contrast, the voltage generator (FIG. 5) laid out according to the present invention minimizes the adverse results brought about by the mismatch mask misalignment of the transistors having the current mirror structure as compared to the voltage generator (FIG. 2) laid out according to the related art to make the level (7B) of the comparison voltage VCORE and the level of the reference voltage VREF to be almost identically output.

As such, the voltage generator (FIG. 5) according to the first embodiment of the present invention realizes more stable and consistent outputs the comparison voltage than the voltage generator (FIG. 2) of the related art. Thereby, making it possible to improve the reliability of the semiconductor device.

A second embodiment of the present invention will be described by a reference voltage generator.

Generally, the reference voltage generator is a device which generates reference potential insensitive to changes in process, voltage, and temperature. As a representative type of the reference voltage generator, there are a Widlar type and a Bandgap type.

Figure 8:
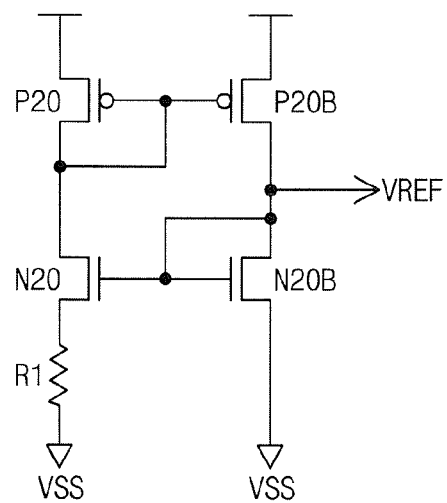
FIG. 8 is a circuit diagram of a Widlar type reference voltage generator according to a second embodiment of the present invention.

Referring to FIG. 8, the Widlar type of the reference voltage generator includes PMOS transistors P20, P20B, NMOS transistors N20, N20B, and a resistor R1.

Specifically, sources of the PMOS transistors P20, P20B are shown connected to a power supply voltage terminal VDD, drains of the NMOS transistors N20, N20B are shown connected drains of each PMOS transistors P20, P20B, a source of the NMOS transistor N20 is shown connected to one terminal of the resistor R1, a source of the NMOS transistor N20B is shown connected to a ground voltage terminal VSS, and the other terminal of the resistor R1 is shown connected to a ground voltage terminal VSS.

And, gates of the PMOS transistors P20, P20B are shown connected to a common drain of the PMOS transistor P20 and the NMOS transistor N20 and gates of the NMOS transistors N20, N20B are shown connected to a common drain of the PMOS transistor P20B and the NMOS transistor N20B, wherein the reference voltage VREF is output from the common drain of the PMOS transistor P20B and the NMOS transistor N20B.

Herein, the resistor R1 is arranged to find a zero temperature coefficient (ZTC), which has a constant temperature change, using the NMOS transistor N20 and line resistance.

The Widlar type of the reference voltage generator configured as shown in FIG. 8 controls gate-source voltage Vgs of the PMOS transistor P20, P20B to be identical and controls the gate-source voltage Vgs of the NMOS transistors N20, N20B to be identical so that the same current flows across the transistors, thereby generating the reference voltage VREF.

At this time, if current drivability across the PMOS transistors P20, P20B and the NMOS transistors N20, N20B, which form the current mirror structure, is substantially the same, the levels of the output reference voltage VREF can be substantially the same as the designed level.

The Widlar type of the reference voltage generator according to the present invention will be described with reference to FIG. 9. The PMOS transistor and the NMOS transistor N20, which form the first path of current, are shown serially arranged in an N well region 50 and a P-type substrate 60 and the PMOS transistor P20B and the NMOS transistor N20B copying voltage of the first path of current to form a second current path are shown arranged in the same structure that the PMOS transistor P20 and the NMOS transistor N20 are shifted in a horizontal direction. And, the resistor R1 is arranged to be connected to the source of the NMOS transistor N20.

Figure 9:
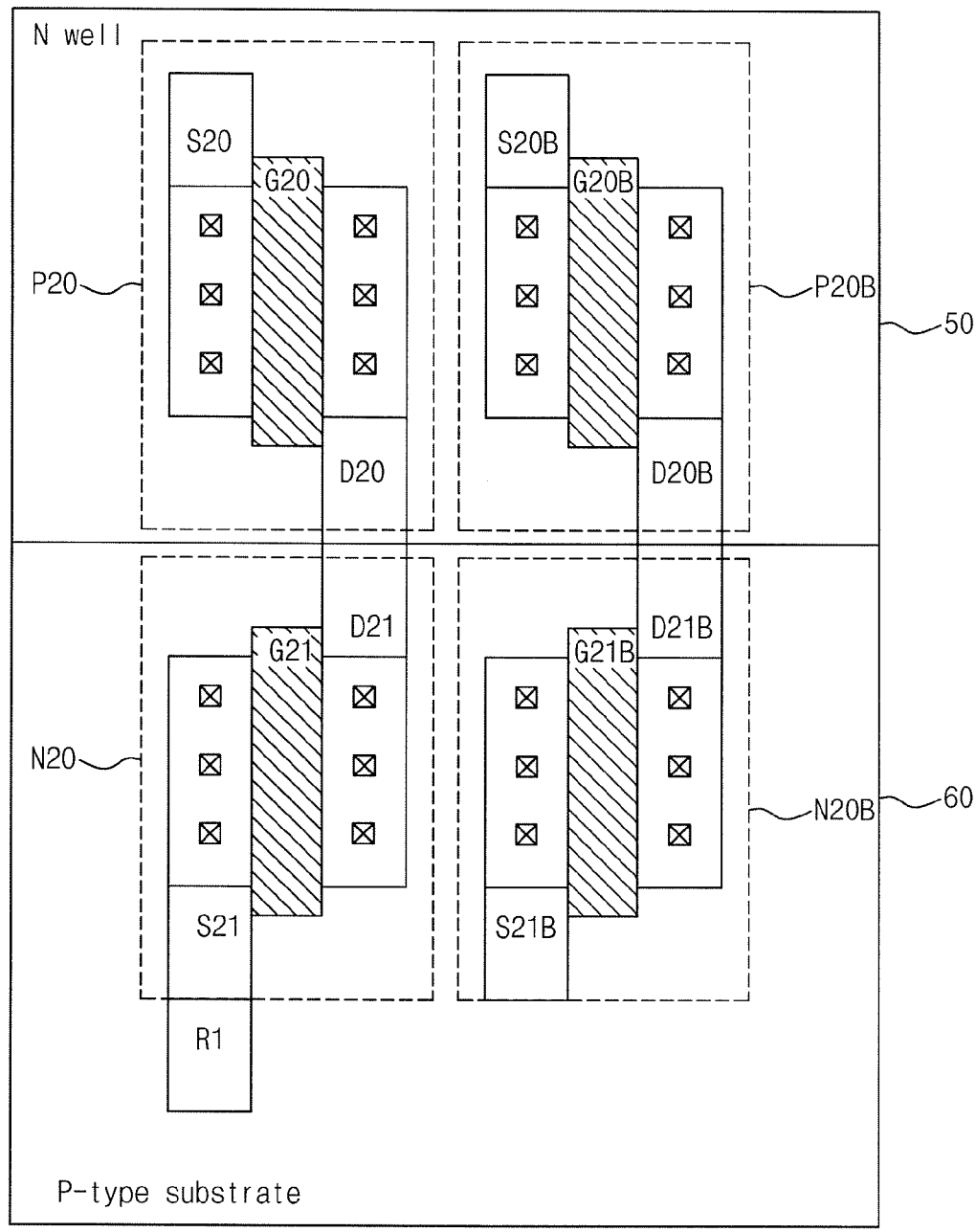
FIG. 9 is a layout diagram of the Widlar type reference voltage generator laid out according to the present invention.

For example, when the sources and the drains of the PMOS transistor P20 and the NMOS transistor N20, which form the first path of current, are arranged in order of a source to a drain (<S20 to D20>, <S21 to D21>) with respect to one direction (in FIG. 9, a right direction). The sources and the drains of the PMOS transistor P20B and the NMOS transistor N20B, which select the second path of current, are arranged in order of a source to a drain (<S20B to D20B>, <S21B to D21B>) with respect to the one direction.

With the reference voltage generator in the Widlar type laid out as shown in FIG. 9, the threshold voltage Vt and the source-drain current Ids of each transistor P20, P20B, N20, N20B are different from the original design criteria due to mismatching of the combination of the masks. The transistors having the current mirror structure are subjected to the same conditions during a fabrication process and as a result the corresponding threshold voltage Vt and the source-drain current Ids of these transistors are almost identical. Thereby the present invention can result in minimizing the adverse results brought about by mask mismatching errors.

As a result, the resultant Widlar type of the reference voltage generator can realize a relatively constant reference voltage VREF. Thereby making it possible to improve reliability of the semiconductor device.

Figure 10:
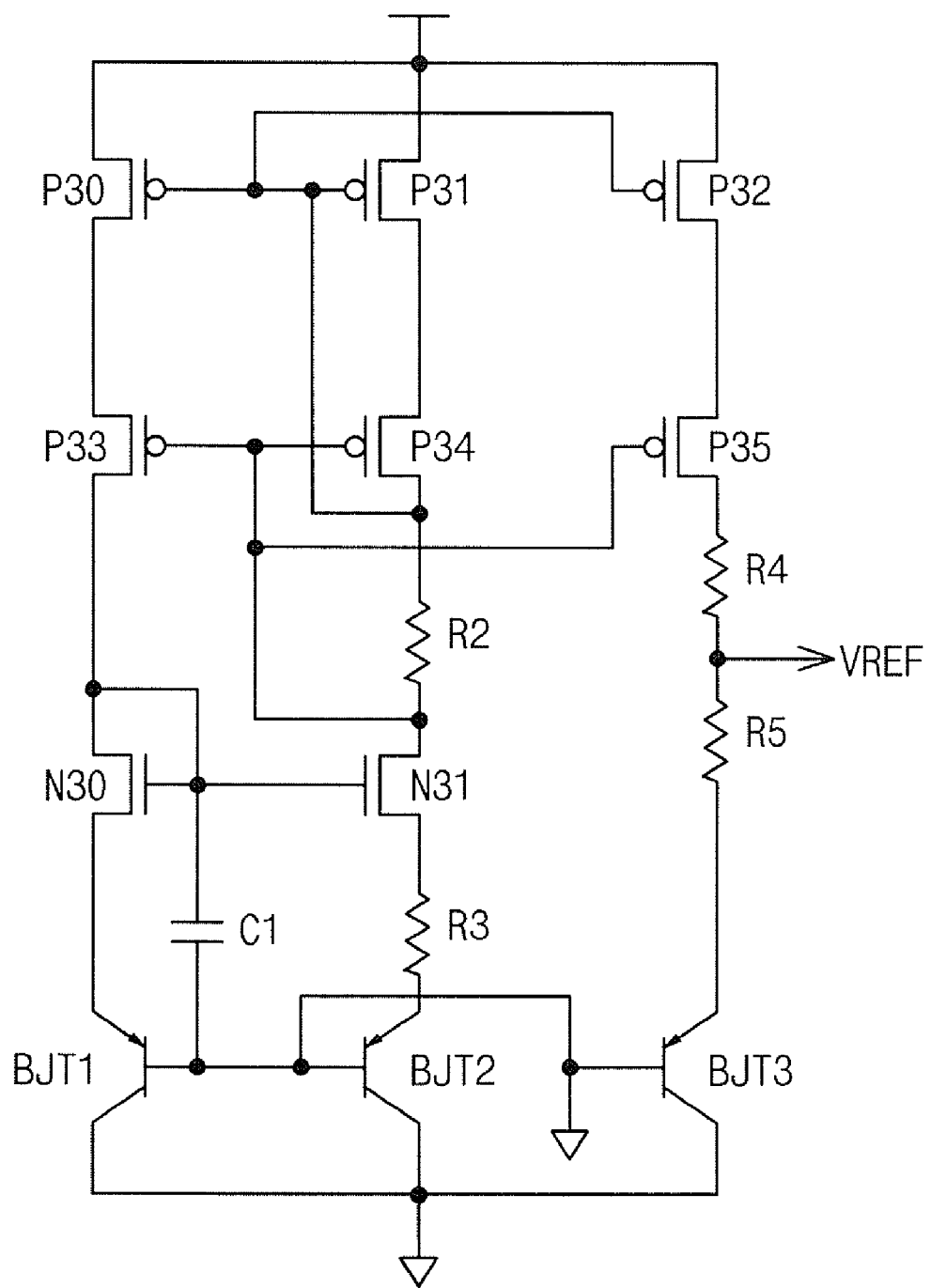
FIG. 10 is a circuit diagram of a Bandgap type reference voltage generator according to the second embodiment of the present invention.

Referring to FIG. 10, the bandgap type of the reference voltage generator, which outputs the reference voltage VREF using a bipolar transistor, includes PMOS transistors P30 to P35, NMOS transistors N30, N31, resistors R2 to R5, a capacitor C1, and bipolar transistors BJT1 to BJT3. Herein, the resistors R2 to R5 are shown arranged to allow the reference voltage generator to be insensitive to a change in temperature using the arranged number of the bipolar transistors and line resistance Herein, the gate-source voltages Vgs of the PMOS transistors P30, P31, P32 are controlled to be substantially identical, the gate-source voltages Vgs of the PMOS transistors P33, P34, P35 are controlled to be identical, and the gate-source voltages of the NMOS transistor N30, N31 are controlled to be identical so that the same current flows across the transistors can be realized. Thereby the reference voltage VREF can be relatively constant.

To this end, although not shown, the Bandgap type of the reference voltage generator of FIG. 10 preferably layouts the PMOS transistors P30, P31, P32 in the same arrangement structure, and layouts the PMOS transistors P33, P34, P35 in the same arrangement structure, and layouts the NMOS transistors N30, N31 in the same arrangement structure. That is, the layout pattern is the same order of a source to a drain with respect to one direction so that they can be subjected to the same conditions during the fabrication process.

Figure 11:
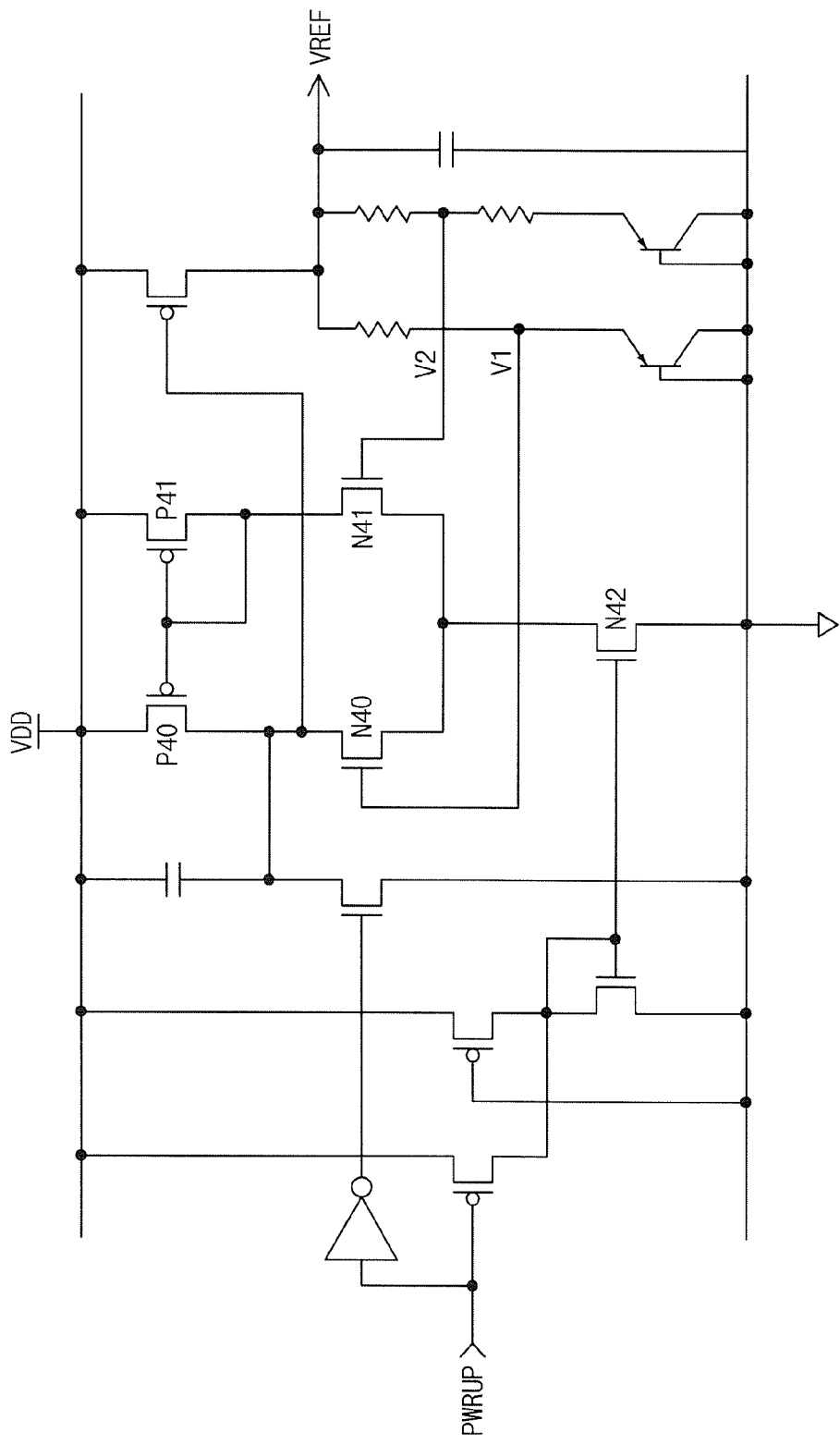
FIG. 11 is a circuit diagram of another Bandgap type reference voltage generator according to the second embodiment of the present invention.

Referring to FIG. 11, another Bandgap type of the reference voltage generator outputting the reference voltage VREF used at low voltage controls the gate-source voltage Vgs of the PMOS transistor P40, P41 forming the current mirror structure to be identical and controls the gate-source voltage Vgs of the NMOS transistors N40, N41 to be identical so that the levels of voltage V1, V2 applied to the gates of the NMOS transistors N40, N41 are substantially identically generated to flow the same current across the transistors, thereby generating the reference voltage.

To this end, although not shown, another Bandgap type of the reference voltage generator of FIG. 11 preferably layouts the PMOS transistors P40, P41 in the same arrangement structure and layouts the NMOS transistors N40, N41, N42 in the same arrangement structure, that is, in the same order of a source to a drain with respect to one direction so that they can be subjected to the same conditions during the fabrication process.

The reference voltage generators according to the second embodiment of the present invention arranges the transistors forming the current mirror structure to have the same layout so as to output a relatively constant reference voltage VREF so that the mismatch malfunction affect of the semiconductor device can be minimized. Thereby, making it possible to improve reliability of the semiconductor device.

A third embodiment of the present invention will be described by a data sense amplifier.

Figure 12:
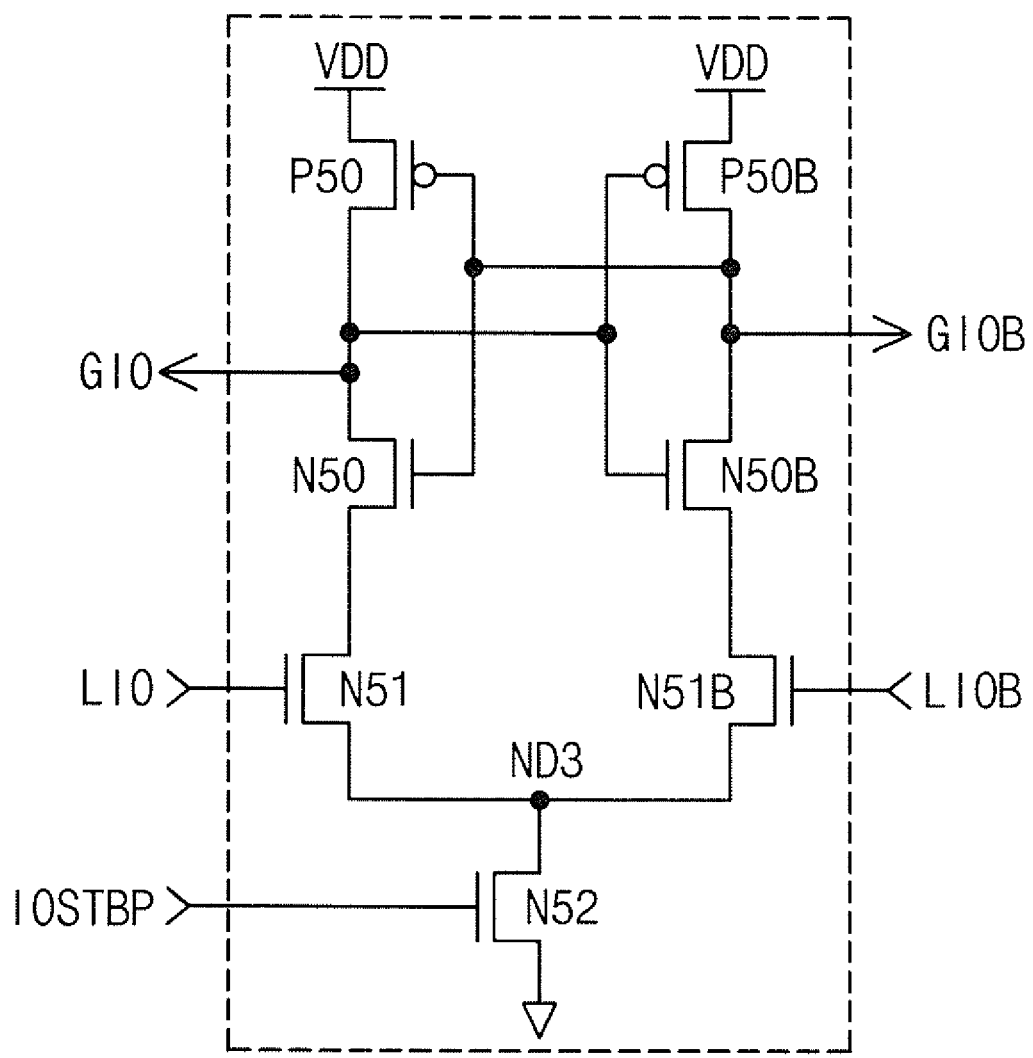
FIG. 12 is a circuit diagram of a data sense amplifier according to a third embodiment of the present invention.

Referring to FIG. 12, the data sense amplifier, which compares and amplifies a voltage difference between input/output lines LIO, LIOB transferring data amplified in a bit line sense amp and outputs it to global input/output lines G10, G10B, includes PMOS transistors P50, P50B and NMOS transistors N50, N50B, N51, N51B, N52.

Specifically, sources of the PMOS transistors P50, P50B are shown connected to a power supply voltage terminal VDD, drains of the NMOS transistors N50, N50B are shown connected drains of each PMOS transistors P50, P50B, drains of the NMOS transistors N51, N51B are connected to sources of each NMOS transistors N50, N50B, and a drain of the NMOS transistor N52 is shown connected to a common source of the NMOS transistors N51, N51B, and a source thereof is shown connected to a ground voltage terminal VSS.

The gates of the PMOS transistor P50 and the NMOS transistor N50 and the global input/output line GIOB are shown connected to a common drain of the PMOS transistor P50B and the NMOS transistor N50B and gates of the PMOS transistor P50B and the NMOS transistor N50B and the global input/output line G10 are shown connected to a common drain of the PMOS transistor P50B and the NMOS transistor N50B, and the local input/output lines LIO, LIOB are shown connected to gates of the NMOS transistors N51, N51B.

The data sense amplifier configured as above is shown driven by a data sense amp enable signal ISOTBP applied to the gate of the NMOS transistor N52 to compare and amplify data voltage carried on the local input/output lines LIO, LIOB applied to the gates of the NMOS transistors N51, N51B and output it to the global input/output lines GIO, GIOB.

Figure 13:
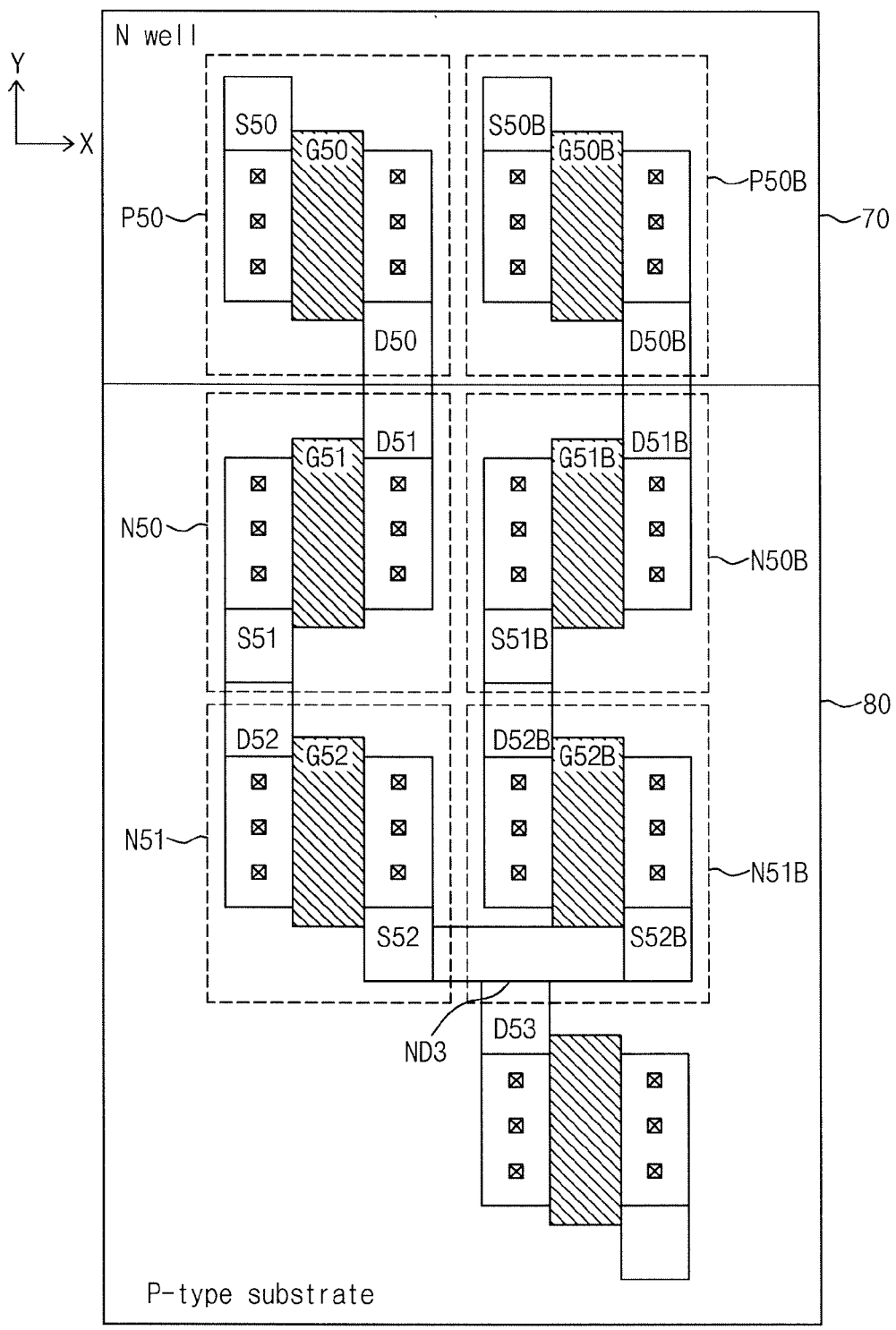
FIG. 13 is a layout diagram of the data sense amplifier of FIG. 12 laid out according to the present invention.

A layout of the data sense amplifier according to the present invention will be described with reference to FIG. 13. The PMOS transistors P50, P50B are shown arranged within an N well region 70 have the same structure based on a Y axis. Also, the NMOS transistors N50, N50B and the NMOS transistors N51, N51B arranged within a P-type substrate 80 are shown having substantially the same structure based on the Y-axis.

In other words, the PMOS transistors P50, P50B, the NMOS transistors N50, N50B, and the NMOS transistors N51, N51B, which are pairs of transistors forming the mirror structure, are shown laid out in the same arrangement structure. That is, in the same order of a source to a drain with respect to one direction so that they are subjected to the same conditions during a process The NMOS transistor N52 is shown arranged to allow a drain D53 to connect to a node ND3 which is a half from the sources of the NMOS transistor N51, N51B.

As a result, the effects of the mask mismatch of the transistors having the mirror structure are reduced which necessarily improves their offset so that the data discrimination of the data sense amplifier is improved. Thereby making it possible to improve operation reliability of the semiconductor device.

Figure 14:
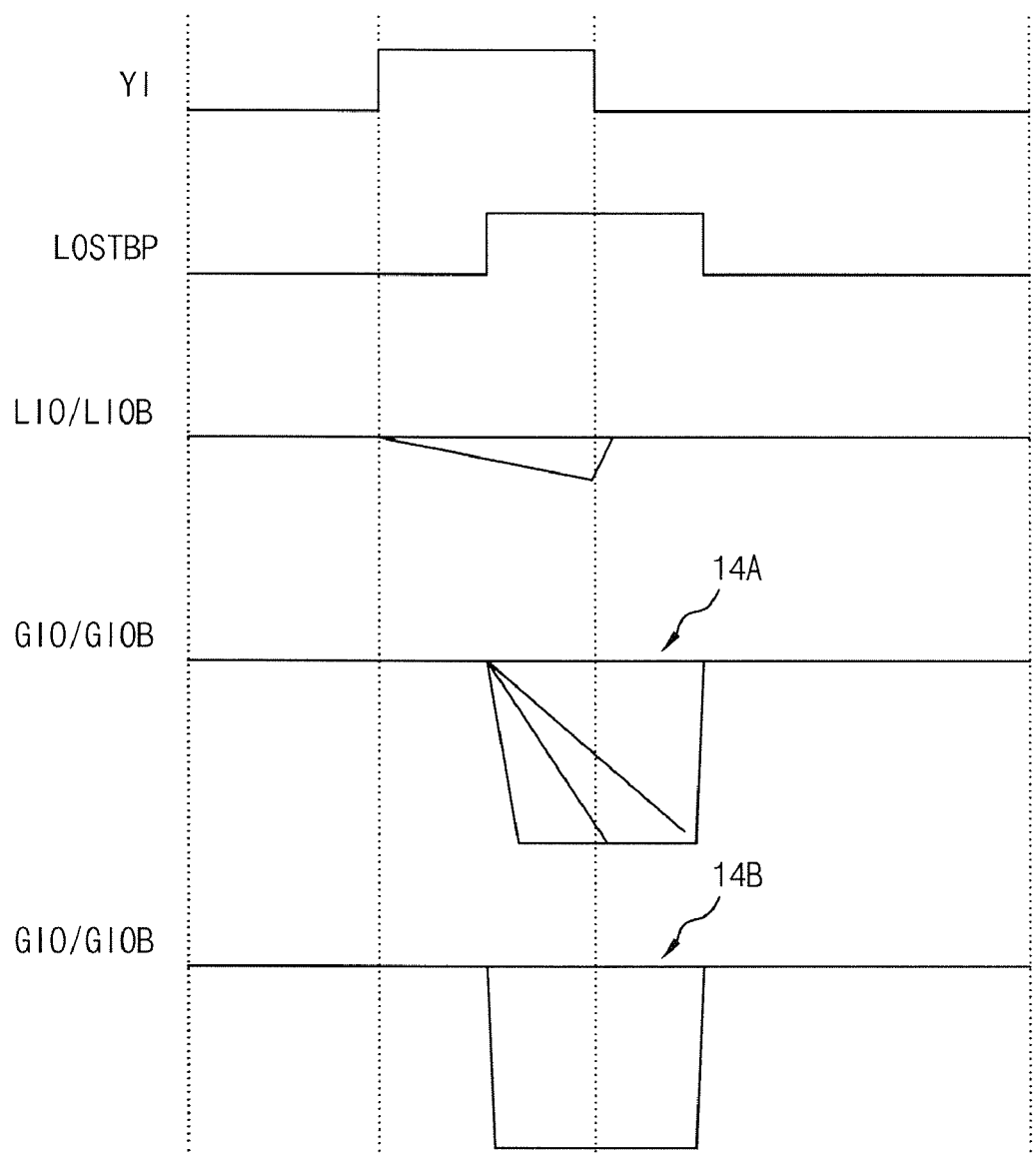
FIG. 14 is a diagram showing operation waveforms output from the data sense amplifier laid out according to the related art and the data sense amplifier laid out according to the present invention

Operation waveforms of the data sense amplifier (not shown) laid out according to the related art and the data sense amplifier (FIG. 13) laid out according to the present invention will be described with reference to FIG. 14.

The data sense amplifier transfers data amplified in the bit line sense amp by a column selection signal Y1 to the local input/output lines LIO, LIOB and compares and amplifies the data voltage carried on the local input/output lines LIO, LIOB applied to the gates of the NMOS transistors N51, N51B by the data sense amp enable signal IOSTBP applied to the gate of the NMOS transistor N52 and outputs it to the global input/output lines GIO, GIOB.

The data sense amplifier laid out according to the related art largely generates the mismatch of the transistors having the mirror structure due to the combination of the masks, thereby making the waveforms (14A) of data DATA, DATAB transferred to the global lines G10, G10B unstable.

On the other hand, the data sense amplifier (FIG. 13) laid out according to the present invention largely minimizes the effects of the mask mismatching fabrication of the transistors having a current mirror structure as compared to the data sense amplifier laid out according to the related art. Thereby making the waveforms (14B) of the data DATA, DATAB transferred to the global lines GIO, GIOB unstable.

As above, the data sense amplifier according to the third embodiment of the present invention arranges the pairs of transistors forming the current mirror structure to have the layout in the same shape so that the performance of the sense amp is improved, making it possible to improve reliability of the semiconductor device.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor device comprising:
    a first transistor unit providing a first current path wherein the first transistor unit having a first layout; and
    a second transistor unit providing a second current path wherein:
        the first and second transistor units being electronically designed as functional parts to a current mirror,
        the second transistor unit having a second layout substantially identical to the first layout,
        the second layout being adjacent to the first layout along a commonly shared lengthwise boundary, and
        the second layout being non-symmetrical relative to the first layout along the commonly shared lengthwise boundary,
    wherein the second layout is arranged in a shifted structure where the first layout is shifted in a horizontal direction.

2. The semiconductor device as set forth in claim 1, wherein each of the first transistor unit and the second transistor unit includes at least two transistors.

3. The semiconductor device as set forth in claim 1, wherein the first transistor unit comprises:
    first power supply transistor which supplies a power supply voltage along the first current path and which supplies a portion of the power supply voltage at a second power supply transistor gate of the second current path; and
    a first current control transistor which controls current flowing through the first current path in accordance to a first voltage applied at a first current control transistor gate of the first current path.

4. The semiconductor device as set forth in claim 3, wherein the second transistor unit comprises:
    a second power supply transistor which supplies the power supply voltage along the second current path and which supplies a portion of the power supply voltage to a first power supply transistor gate of the first current path; and
    a second current control transistor which controls current flowing through the second current path in accordance to a second voltage applied at a second current control transistor gate of the second current path.

5. The semiconductor device as set forth in claim 4, wherein the first and second power supply transistors include a PMOS transistor gate commonly connected to any one of the first current path and the second current path.

6. The semiconductor device as set forth in claim 4, wherein the first and second power supply transistors include a PMOS transistor gate connected to the first current path or the second current path.

7. The semiconductor device as set forth in claim 4, wherein the first and second current control transistors include a NMOS transistor gate commonly connected to any one of the first current path and the second current path.

8. The semiconductor device as set forth in claim 4, wherein the first and second current control transistors being NMOS transistors in which the first voltage connected to the first current control transistor gate being different from the second voltage connected to the second current control transistor.

9. The semiconductor device as set forth in claim 8, wherein the first voltage being a reference voltage and the second voltage being a comparison voltage.

10. The semiconductor device as set forth in claim 8, wherein the first voltage being a local input/output line voltage and the second voltage being an inverted input/output line voltage.

11. The semiconductor device as set forth in claim 1, wherein the semiconductor device being a voltage generator.

12. The semiconductor device as set forth in claim 1, wherein the semiconductor device being a sense amplifier.

13. The semiconductor device as set forth in claim 1, wherein the semiconductor device being a reference voltage generator.

14. A layout method of a semiconductor device including the steps of:
   arranging a first transistor unit having a first layout providing a first current path; and
   arranging a second transistor unit providing a second current path, wherein the first and second transistor units being electronically designed as functional parts to a current mirror, the second transistor unit having a second layout substantially identical to the first layout, the second layout being adjacent to the first layout along a commonly shared lengthwise boundary, and the second layout being non-symmetrical relative to the first layout along the commonly shared lengthwise boundary,
   wherein the second layout is arranged in a shifted structure where the first layout is shifted in a horizontal direction.

15. The layout method of a semiconductor device as set forth in claim 14, wherein the first and second transistor units are laid out by a combination of at least one mask.

16. The layout method of a semiconductor device as set forth in claim 14, wherein the first transistor unit includes:
   at least one PMOS transistor arranged to supply power supply voltage to the first current path laid out in an N well region; and
   at least one NMOS transistor arranged to be electrically connected to the PMOS transistor arranged to control current from the first current path laid out in a P-type substrate region.

* * * * *